Jan. 28, 1969 R. SMITH 3,424,927

SOLID STATE AC COUPLING

Filed Jan. 26, 1966

INVENTOR.
ROBERT SMITH

BY John A. Brady
ATTORNEY.

United States Patent Office 3,424,927

Patented Jan. 28, 1969

3,424,927

SOLID STATE AC COUPLING

Robert Smith, Lexington, Ky., assignor to International Business Machines Corporation, Armonk, N.Y., a corporation of New York Filed Jan. 26, 1966, Ser. No. 523,227
U.S. Cl. 307—280 17 Claims
Int. Cl. H03k 3/26

This invention relates to solid state electronic circuits. In particular, this invention provides improved utilizations of the collector following effect to improve circuit design for recognizing only transistions of signals without the use of capacitors, coils, or similar circuit elements.

The recent emphasis on mass produced circuits has focused emphasis on the use of circuit phenomena which are relatively available for incorporation by the processing techniques used. For example, one processing technique with which this invention is useful fabricates complete, operative circuits by external processing on a solid unit of semi-conductive material. Thus, etching, infusion of alloying materials, and deposition of conductive paths are examples of techniques which are readily available. On the other hand, incorporation into the circuits of elements such as capacitors and coils is less readily available especially when such elements must be large in size. Therefore, use of phenomena more readily available becomes an attractive circuit design where this replaces the function of circuit elements which are not easily incorporated into the circuit during manufacture.

The collector following effect is a known phenomenon exhibited by almost all transistors. This effect is experienced after a transistor is heavily saturated and when the collector of the transistor is biased for operation. Reduction of the input to a level less than saturation causes the collector potential to follow the base potential for a short period of time which is largely defined by the geometry and doping of the transistor. After the short "follow time," the collector potential moves the other direction because the usual long term transistor action then occurs.

The mechanism of the collector following effect is not fully understood. However, the effect is clearly dependent in some way upon the storage of current carriers in the region of the base of the saturated transistor. Removal of the voltages responsible for the saturation leaves the carriers for a limited time during which an operating voltage at the collector is effective to provide a current which is fostered by the current carriers. The current flows freely across the collector-base junction, which otherwise tends to oppose current flow. Circuits can then be found by the current either through the input lead, through the base, or through some combination or other circuit, depending upon the specific components of the circuits involved.

The limited time in which the collector following effect operates before automatically disappearing is a phenomenon used in accordance with this invention. It is not herein claimed as invention to use the phenomenon to limit the passage of a longer, continuous current, and to thereby act as a time controlling or AC coupling. In so using the phenomenon, the major circuit element usually replaced is a capacitor, since it is classical to locate a capacitor where it will fill with charge in a limited period of time and then subsequently block at DC voltage.

Further in accordance with this invention a gating lead is supplied and adapted to inhibit or destroy the collector following effect as desired. Thus, not only is the collector following effect used, but influences on the effect are analyzed and recognized as useful. The coordination of the effect with its characteristics provides circuit design which is both more useful and different in kind from the mere use of the effect as a pulse limiting element.

It is an object of this invention to provide improved AC coupling using essentially only solid state elements.

It is a further object of this invention to provide improved circuits which eliminate difficulty fabricated components such as capacitors and coils.

It is still another object to provide coupling and gating using essentially only solid state elements.

It is a more specific object of this invention to provide a solid state AND circuit of improved design, particularly in the optimization of the types of circuit elements used.

It is another more specific object of this invention to provide a solid state control for a bistable circuit of improved design, particularly in the optimization of the types of circuit elements used and in the reduced power required by the circuit.

Thus, in accordance with this invention a connection is provided in each circuit which is properly situated and adapted to inhibit the collector following effect. In the AND circuit the connection is essentially circuit switching means to switch is a signal which overpowers the saturation signal on the base of the transistor thereby removing the transistor from saturation. In the control for a bistable circuit, the gating signal is one which opposes the voltage from the base-emitter junction of the transistor.

An AC or transition coupling is, of course, a connection which passes only a brief signal even though the input to the connection is relatively long. Thus, such a connection passes only transitions, as distinguished from continuous signals, into a circuit. AC coupling is commonly used in logical circuits and similar data processing applications. These circuits are timed and their operations are compartmentalized by clock pulses created conventionally by an oscillator or similar clock. However, the clock pulses must be communicated throughout the entire machine, and it therefore is not desirable to make them so short that high frequency transmission problems are increased. The clock pulses are therefore so long in time that the logical changes created by one signal could occur while the same clock pulse exists and could then cause subsequent logical changes before the subsequent clock pulses. This is avoided, however, by the use of AC coupling within the logic. When AC coupling is used the effective signal from any signal source can be so short that it will only causes one response during one clock time.

The foregoing and other objects, features and advantages of the invention will be apparent from the following more particular description of preferred embodiments of the invention, as illustrated in the accompanying drawings.

Figures 1, 2:
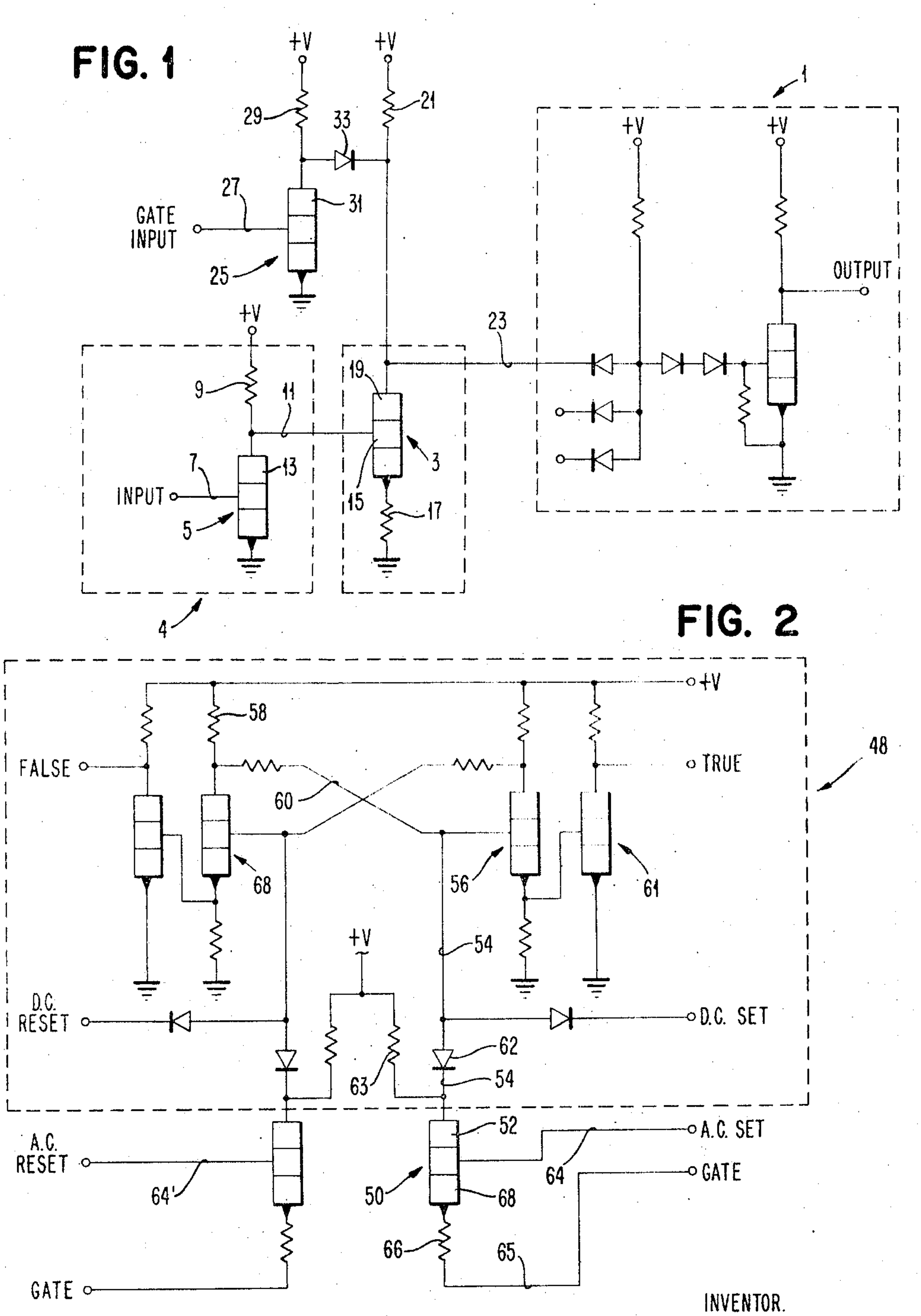
FIG. 1 illustrates a preferred form of the AND circuit in accordance with this invention.
FIG. 2 illustrates a preferred form of the input to a bistable circuit in accordance with this invention.

Reference is made to FIG. 1. The circuit elements 1 shown on the right of the drawing and enclosed in dotted outline made a logical OR circuit. The OR circuit elements are entirely conventional and therefore need not be further discussed. OR circuit 1 is shown here merely to illustrate a desirable environment in which the invention is used.

Transistor 3 is the collector following transistor. Almost all transistors exhibit this effect to some extent and could be used in this circuit. If desired, the geometry, doping, and similar characteristics of transistor 3 can be especially selected so as to provide the effect for a time and under circuit conditions suitable to the environment and purposes of use.

Driver circuit 4 having driver transistor 5 provides the saturating voltage for transistor 3. Driver transistor 5 may be conventional in every respect. Its status is controlled by input lead 7. It is connected in grounded emitter configuration with the usual load resistor 9 biased by a voltage +V. Lead 11 connects the collector 13 of transistor 5 with the base 15 of transistor 3. The circuit from transistor 5 through the base-emitter junction of transistor 3 connects to ground through a resistor 17.

Resistor 17 is not an essential part of the circuit since any passive connection to ground, including a direct connection, would not alter the basic operation of this preferred circuit. However, in the preferred circuit shown resistor 17 performs an important function during the bringing of transistor 3 to a condition of satuation. As saturation current begins to flow, current will be allowed to pass through transistor 3. Resistor 17 is large enough to prevent a drop of voltage at the output of transistor 3 which would be recognized by OR circuit 1.

As will be apparent, when a signal on input lead 7 biases transistor 5 on or conductive, collector 13 of transistor 5 is substantially grounded. Current flows from +V through resistor 9, and through transistor 5 to ground, thereby substantially bypassing and thereby eliminating the input to the base 15 of transistor 3. On the other hand, when a signal on input lead 7 biases transistor 5 off, the transistor 5 blocks current flow. Lead 11 then presents a relatively low impedance to the voltage source +V as it appears after passing through resistor 9. Therefore, the current path is from +V, through resistor 9, through the base-emitter junction of transistor 3, and through resistor 17 to ground. The voltages and circuit elements such as resistors 9 and 17 are selected so that transistor 3 will be heavily saturated when transistor 5 is biased off, unless this result is otherwise inhibited.

The collector 19 of transistor 3 is permanently connected to a voltage source +V thorugh a resistor 21. This connection provides the collector-emitter bias or operating voltage in the order of magnitude usual to that employed with transistor 3 during any normal operation of transistor 3. With this connection as so far described, the collector following effect will occur. The lead 23 into OR circuit 1 is the connection by which the voltages produced are sensed and utilized.

Thus, in one status of operation transistor 5 will be biased off by lead 7. Then transistor 3 will be heavily saturated. It is generally a relatively long duration change on the input of lead 7 which is to be transferred to OR circuit 1 as a relatively short pulse. A short pulse can occur automatically in response to any short or relatively long signal on lead 7 which biases transistor 5 on because for a brief period while the saturation is leaving transistor 3, the collector following effect occurs. Thus, a brief negative signal appears at collector 19 and is transferred by lead 23 into OR circuit 1. In a short time the effect disappears, and collector 19 then goes up to the potential +V.

The signal on lead 7 later returns to a status which biases transistor 5 off. Initially during this action transistor 3 will be biased to conduction so that current will flow from its collector 19 to ground. However, as mentioned, resistor 17 is selected to be large enough to create a significant voltage drop in response to current carried. This voltage drop will be large enough to prevent collector 19 from dropping to a value at which a signal on output lead 23 will be effective to OR circuit 1.

The gate or AND control of this circuit is basically supplied by transistor 25 and its associated circuit elements. Transistor 25 is a conventional transistor connected and biased as is usual. It has an input lead 27 to switch transistor 25 to a conductive (on) or nonconductive (off) status. Voltage source +V connects through resistor 29 to the collector 31 of transistor 25. As will be discussed, resistor 29 is significantly smaller in resistance than resistor 21. Collector 31 of transistor 25 is connected to the junction of resistor 21 and collector 19 of transistor 3 through a diode 33.

In operation the gate or AND condition is open or satisfied when the signal on input 27 renders transistor 25 conductive. In this event the signal from +V through resistor 29 is essentially grounded through transistor 25. The collector following effect of transistor 3 as above described is not impaired because diode 33 isolates the voltage on resistor 21 from transistor 25.

When the signal on input 27 renders transistor 25 nonconductive, the collector following effect is inhibited. In this case the connection to output lead 23 can be considered to be ineffective or gated closed regardless of changes to the input of transistor 5. This occurs because the voltage +V passes through resistor 29, finds an open circuit at transistor 25 and therefore is directed through diode 33. Currents flowing from +V through resistor 21 do not overcome the collector following effect. However, resistor 29 is significantly smaller in resistance than resistor 21. The voltage +V as it appears at the junction of resistor 29 and diode 33 acts as a strong or control voltage. The voltage provided at collector 19 of transistor 3 is then great enough to act across the collector-emitter junction of transistor 3 to prevent transistor 3 from becoming saturated by the signal on lead 11 which otherwise would cause saturation.

Since the voltage supply to transistor 5 is also +V, the magnitude of load resistor 9 must be considered. As will be readily appreciated by solid state circuit designers, it would be possible to design the circuit with different voltages which would assure the desired result. In the circuit as shown, when transistor 25 is biased off the resistors 21 and 29 act as though in parallel with a voltage +V and the current multiplication of transistor action causes more current to exist across the transistor than enters through the base. The parallel resistance of resistors 21 and 29 therefore should be considerably smaller in ohm value than that of resistor 9 to positively prevent the voltage +V associated with load resistor 9 of transistor 5 from saturating transistor 3. The basic design criterion is that the voltage presented on the input must be in the order of magnitude or less than the voltage presented at the collector. The various components and values must be selected with the operation in mind, but the selection of specific components is merely a matter of choice of the designer.

It will be noted that an AND circuit or gate is provided which is entirely made from solid state elements. It is ideal for fabrication by presently known mass production techniques which create the entire circuit from a solid piece of semi-conductive material. The circuit is believed to be optimized in many respects since it requires only a single active element for each function.

Reference is made to FIG. 2. FIG. 2 shows coupling components in accordance with this invention and a bistable circuit. A primary advantage in the coupling circuit of FIG. 2 is that gating is provided by a circuit which has so called "down level loading," thereby consuming low power.

The bistable circuit 48, enclosed in dotted outline, is basically a conventional latch circuit and therefore need not be discussed in detail. The circuit is simply one in which at least two active elements are cross connected so that the conductive status of at least one active element is controlled by the conductive status of at least one other active element. The bistable circuit 48 shown and variations of it, such as variations to form an astable multivibrator, are familiar to those skilled in the art. The DC set input is used to force and hold the circuit to one status. However, it is the AC set input which is more often used to conduct logical operations. Thus, a relatively long signal in a computing or similar system may be one with which it is desired to switch the bistable circuit, but to leave it in a condition in which it may be changed by other inputs. Thus, a frequency controlling or AC coupling is desired.

In FIG. 2 two-gated, AC couplings are provided, one to switch the latch 48 to one status and one to switch the latch 48 to the opposite status. Only one need be described since the two are identical.

The gated, AC coupling comprises the collector following transistor 50 the collector 52 of which is connected to a lead 54, which is operative by essentially direct connection into the cross-coupling circuit of latch 48. As discussed above, the collector following transistor is not essentially different from other transistors. The geometry, doping, and similar characteristics may be selected so as to provide the collector following effect for a time and under circuit conditions suitable to the environment and purposes of use.

Assuming transistor 56 in latch circuit 48 is biased on, voltage +V connects through resistor 58 to cross-coupling lead 60 to lead 54. Although there is a considerable voltage drop, a sufficient voltage bias transistor 56 on remains and this is a significant voltage in the circuit shown (actually, in one embodiment about 1.4 volts) because it goes to ground only through a resistor in parallel with the emitter-base junction of transistor 61. This significant voltage is thus applied through diode 62 to collector 52 of transistor 50 and is suitable in magnitude to constitute an operating voltage for the collector following effect. Actually, as shown, diode 62 is normally back biased by the voltage source +V acting through resistor 63. This back bias technique is a prior art arrangement to isolate latch 48 from noise which may occur at the circuits external to diode 62. For purposes of the circuit under consideration, the important feature is that some operating voltage exists at the collector of transistor 50 so that a limited pulse will occur by virtue of the collector following effect. This pulse will be coupled freely in the forward direction through diode 62.

The collector following effect also requires a heavy saturation of transistor 50. This is provided by base lead 64, which connects the input the effectiveness of which is to be limited in duration. Also, the signal on lead 64 is to be effective only when the gate lead 65 is at a DOWN level.

Resistor 66 in the emitter 68 to lead 65 circuit is important in the specific circuit shown to isolate the effect of the rising edge of a signal bringing transistor 50 to saturation. An IR drop is created thus limiting the voltage drop across transistor 50 to an ineffective level in a manner entirely similar to the action of resistor 17 as described in connection with FIG. 1.

The continuous signal on lead 64 is made large enough to heavily saturate transistor 50. That signal is in series circuit with lead 65, but the voltage on lead 65 in the DOWN or gated on state is designed to be small enough to permit heavy saturation and the total impedance to ground on line 65 is designed then to be small. (Driver circuit 4 in FIG. 1 illustrates a possible connection accomplishing this. Line 11 would be connected to lead 65, assuming of course, that the transistor is selected to be able to carry the saturation current required.) Generally the circuit will be gated off by a selectable, different UP signal on lead 65. In this event no sufficient saturating current will flow through the base-emitter junction of transistor 50, because the second or UP signal opposes the signal on lead 64 with a voltage sufficient to prevent heavy saturation. Preferably, the potential on lead 64 and the opposing potential on lead 65 are designed to be about equal in magnitude. Thus, when the voltage on lead 65 is switched to its UP or high voltage the collector following effect is inhibited by this loss of saturating current. An important feature is that with the gate signal on line 65 UP, no substantial current flows and electrical power is thereby conserved.

The gate is open by merely switching the signal on lead 65 to its DOWN value, which is significantly below the voltage on lead 63 (preferably substantially ground). As mentioned, the IR drop across resistor 66 is designed to be large enough to prevent the voltage at collector 52 from dropping so low that it is passed as a signal through diode 62.

Assuming that the gate signal is DOWN, the collector following effect is conditioned to be fully active. Thus, a sudden drop of input on input 64 will cause collector 52 of transistor 50 to drop in the more negative direction. Assuming that input 64 is grounded, collector 52 follows the base to substantially ground level. This will last only for the short time that the collector following effect is operative. Collector 52 will then tend to return to the more positive direction even though the new value persists on input 64. (It will be clear that driver circuit 4 in FIG. 1 is also illustrative as a possible circuit for connection to input lead 64. Lead 11 would be connected to lead 64.)

The more negative signal on collector 52 connects by lead 54 to tend to turn transistor 56 in latch circuit 48 off. As will be readily apparent, this tends to turn transistor 68 on. In this manner one status of latch circuit 48 is selected by a proper input on the lead 64 on the right hand elements of FIG. 2, assuming that the gate signal on line 65 is DOWN. An identical input to the corresponding lead 64' in the left hand elements will bring latch circuit 48 to the opposite status.

In this coupling circuit, shown here in a preferred form with a bistable circuit, a gating capacity is provided and power is conserved. The circuit is believed to be optimized since only one active element is used in each input system.

It will be appreciated that in both of the circuits shown the saturating input is removed by dropping the saturating voltage to ground. This is definitely preferable in many applications because the collector of the saturated transistor then follows the signal to a positively established ground potential. In fact a relatively large current flows freely from the collector, on the input lead out of the base and then to ground. When the input lead is open circuited, rather than brought to a lower potential, a less positive action occurs.

While the invention has been particularly shown and described with reference to preferred embodiments therof, it will be understood by those skilled in the art that the foregoing and other changes in form and details may be made therein without departing from the spirit and scope of the invention.

I claim:

1. An electrical circuit for gated, AC coupling comprising:
- at least one solid state device having an input and an output,
- means connecting the output of said device during normal operation with an operating voltage so that the collector following effect will be exhibited by said device when a heavily saturating voltage is removed from said input,
- means to connect a heavily saturating voltage to said input, and
- selectable means connected to said device and adapted to bring said device to an electrical status at which the collector following effect cannot occur regardless of said saturating voltage at said input.

2. The circuit as in claim 1 also comprising a passive impedance element in the input circuit of said device to significantly reduce the output during times when said device is being saturated by said saturating voltage.

3. An electrical circuit for gated, AC coupling comprising:
- a transistor having a collector, a base, and an emitter,
- means connecting said collector to a source of operating voltage so that the collector following effect will be exhibited by said transistor when a heavily saturated voltage is removed from said base, means connected to said base for applying a heavily saturating voltage to said base, switchable means to selectively connect a source of control voltage to said collector of such magnitude in said circuit that when said switchable means connects said control voltage to said collector, the potential from collector to emitter of said transistor prevents said heavy saturation regardless of said saturating voltage at said input.

4. The circuit as in claim 3 also comprising a passive impedance element in circuit with said emitter to significantly reduce the output at said collector during times when said device is being saturated by said saturating voltage.

5. The circuit as in claim 3 wherein said means connected to said base include an input lead to said base and an electrically passive connection from said emitter to a plane or reference potential.

6. The circuit as in claim 5 wherein said means connected to said base also includes a voltage source to apply substantially all of said saturating voltage to said input lead.

7. The circuit as in claim 3 wherein said switchable means is a transistor operable by a signal at its input.

8. The circuit as in claim 7 wherein said means connected to said base include an input lead to said base, a voltage source to apply substantially all of said saturating voltage to said input lead, and a transistor operable by a signal at its input to switch said voltage into a circuit substantially bypassing said input lead and to switch said potential into a circuit with said input lead in which said input lead presents a relatively low impedance.

9. The circuit as in claim 8 also comprising a passive impedance element in circuit between said emitter and a plane of reference potential to significantly reduce the output at said collector during times when said device is being saturated by said saturating voltage.

10. An electrical circuit for gated, AC coupling comprising:

a transistor having a collector, a base, and an emitter, means connecting said collector to a source of operating voltage for said transistor, means connecting said emitter in circuit with said operating voltage so that the collector following effect will be exhibited by said transistor when a heavily saturating voltage is removed from said base, means connected to the emitter-base circuit of said transistor for applying a predetermined heavily saturating voltage to said transistor, means to selectively connect at least two different voltages in the emitter-base circuit of said transistor, said connections and said voltages being such that one of said two voltages permits said predetermined voltage to heavily saturate said transistor and the other of said voltages opposes said predetermined voltage so that said transistor is not heavily saturated regardless of said predetermined voltage.

11. The circuit as in claim 10 also comprising a passive impedance element in circuit with said emitter to significantly reduce the output of said collector during times when said device is being saturated by said saturating voltage.

12. The circuit as in claim 10 wherein said at least two different voltages both are in series circuit with said means connecting said emitter in circuit with said operating potential.

13. The circuit as in claim 12 also comprising a passive impedance element in circuit with said emitter to significantly reduce the output of said collector during times when said device is being saturated by said saturating voltage.

14. A circuit in which the circuit as in claim 10 is connected with said collector in connection with the cross connection circuit of a bistable circuit for switching the status of said bistable circuit, said bistable circuit comprising at least two active elements cross connected by at least one said connection circuit for control of the conductive status of one of said active elements by the conductive status of the other of said active elements.

15. A circuit in which the circuit as in claim 11 is connected with said collector in connection with the cross connection circuit of a bistable circuit for switching the status of said bistable circuit, said bistable circuit comprising at least two active elements cross connected by at least one said connection circuit for control of the conductive status of one of said active elements by the conductive status of the other of said active elements.

16. A circuit in which the circuit as in claim 12 is connected with said collector in connection with the cross connection circuit of a bistable circuit for switching the status of said bistable circuit, said bistable circuit comprising at least two active elements cross connected by at least one said connection circuit for control of the conductive status of one of said active elements by the conductive status of the other of said active elements.

17. A circuit in which the circuit as in claim 15 is connected with said collector in connection with the cross connection circuit of a bistable circuit for switching the status of said bistable circuit, said bistable circuit comprising at least two active elements cross connected by at least one said connection circuit for control of the conductive status of one of said active elements by the conductive status of the other of said active elements.

References Cited

UNITED STATES PATENTS 3,098,936 7/1963 Isabeau -------- 307—280 XR

OTHER REFERENCES

IBM Technical Disclosure Bulletin, vol 7, No. 6, November 1964, p. 428.

ARTHUR GAUSS, *Primary Examiner.*

STANLEY T. KRAWCZEWICZ, *Assistant Examiner.*

U.S. Cl. X.R.

307—300